(12) United States Patent
Lv

(10) Patent No.: US 12,328,021 B2
(45) Date of Patent: Jun. 10, 2025

(54) ELECTRONIC DEVICE

(71) Applicant: GUANGDONG OPPO MOBILE TELECOMMUNICATIONS CORP., LTD., Guangdong (CN)

(72) Inventor: Gaoli Lv, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 693 days.

(21) Appl. No.: 17/715,714

(22) Filed: Apr. 7, 2022

(65) Prior Publication Data

US 2022/0231528 A1 Jul. 21, 2022

Related U.S. Application Data

(63) Continuation of application No. PCT/CN2020/113172, filed on Sep. 3, 2020.

(30) Foreign Application Priority Data

Oct. 9, 2019 (CN) .......................... 201910955492.2
Oct. 9, 2019 (CN) .......................... 201921695254.4

(51) Int. Cl.
*H02J 7/00* (2006.01)
*H01M 10/42* (2006.01)
*H05K 1/14* (2006.01)

(52) U.S. Cl.
CPC ..... *H02J 7/00309* (2020.01); *H01M 10/4257* (2013.01); *H01M 2010/4271* (2013.01); *H05K 1/147* (2013.01); *H05K 2201/10037* (2013.01)

(58) Field of Classification Search
CPC .............. H02J 7/00309; H02J 7/0045; H01M 10/4257; H01M 2010/4271;
(Continued)

(56) References Cited

U.S. PATENT DOCUMENTS 8,395,256 B2 * 3/2013 Boesch ................ H05K 9/0056
257/734
9,553,342 B2 * 1/2017 Shin .................... H01M 50/569
(Continued)

FOREIGN PATENT DOCUMENTS

CN 204291066 U 4/2015
CN 205071069 U 3/2016
(Continued)

OTHER PUBLICATIONS

Extended European Search Report for EP Application 20875177.6 mailed Nov. 11, 2022. (11 pages).
(Continued)

Primary Examiner — M Baye Diao
(74) Attorney, Agent, or Firm — Young Basile Hanlon & MacFarlane, P.C.

(57) ABSTRACT

An electronic device, including: a housing, a battery, and a circuit board assembly. The housing is provided with a power interface. The battery includes a battery protection board and a cell. The circuit board assembly is disposed in the housing and is electrically connected to the power interface. The circuit board assembly includes a first board, a second board, a first flexible circuit board, and a second flexible circuit board. The first flexible circuit board is connected to the battery protection board and the first board, and the second flexible circuit board is connected to the battery protection board and the second board.

19 Claims, 4 Drawing Sheets

(58) Field of Classification Search
CPC ........... H01M 2220/30; H01M 10/425; H01M 50/284; H01M 50/519; H01M 10/42; H05K 1/147; H05K 2201/10037; G06F 1/1635; G06F 1/26; H04M 1/0274; H04M 1/0277; H04M 1/0262
USPC ......................................................... 320/137
See application file for complete search history.

(56) References Cited

U.S. PATENT DOCUMENTS

| | | | |
|---|---|---|---|
| 10,477,708 B2 * | 11/2019 | Lee | H05K 5/0069 |
| 2008/0187823 A1 * | 8/2008 | Byun | H01M 10/4257 |
| | | | 174/250 |
| 2017/0194618 A1 * | 7/2017 | Dabov | H01M 10/058 |
| 2018/0288889 A1 * | 10/2018 | Fordham | H01M 10/425 |

FOREIGN PATENT DOCUMENTS

| | | | | |
|---|---|---|---|---|
| CN | 106790785 A | | 5/2017 | |
| CN | 207320267 U | | 5/2018 | |
| CN | 207410590 U | * | 5/2018 | ............... H05K 1/14 |
| CN | 210984782 U | | 6/2018 | |
| CN | 210866339 U | | 6/2020 | |
| JP | 2003272584 A | | 9/2003 | |
| WO | WO-2019018990 A1 | * | 1/2019 | ............... H02J 7/00 |

OTHER PUBLICATIONS

Chinese First Office Action and English translation for Chinese Application No. 201910955492.2, mailed Oct. 12, 2024, 17 pages.
International Search Report with English Translation for PCT/CN2020/113172 mailed Apr. 12, 2020 (16 pages).
Notice of granting patent right with English Translation for utility model Chinese Application No. 201921695254.4 mailed Oct. 6, 2020 (4 pages).

* cited by examiner

ELECTRONIC DEVICE

CROSS-REFERENCE TO RELATED APPLICATION(S)

The present application is a continuation-application of International (PCT) Patent Application No. PCT/CN2020/113172 filed Sep. 3, 2020, which claims priority and rights of Chinese Patent Application No. 201921695254.4, filed on Oct. 9, 2019 and Chinese Patent Application No. 201910955492.2, filed on Oct. 9, 2019, the entire contents of all of which are hereby incorporated by reference.

TECHNICAL FIELD

The present disclosure relates to the technical field of electronic devices, in particular to an electronic device.

BACKGROUND

In the related art, during some electronic devices being charged, a current may arrive a second board first from a power interface, then be transported from the second board to a first board through a flexible circuit board, and further be transported from the first board to a battery through another flexible circuit board, and accordingly a charging path is relatively long. In response to the electronic devices are quickly charged in a current increasing manner, due to a current flowing path being relatively long and a current flow being relatively large, a current loss may be easy to be caused, such that a heat during the electronic devices being charged may be increased and a charging efficiency may be reduced. Furthermore, the electronic devices may be burnt, even safety accidents may be caused, such as the electronic devices on fire, the batteries explosions, and so on.

SUMMARY

The present disclosure aims to solve at least one of the technical problems in the related art. An electronic device is provided in the present disclosure and has a short charging path and low heat as charging, and high safety and so on.

According to a first aspect of the present disclosure, an electronic device is provided and includes a housing defined with a power interface on the housing; a battery arranged in the housing and including a battery protection board and a cell; a circuit board assembly arranged in the housing, electrically connected to the power interface, and including a first board located at one side of the battery, a second board located at the other side of the battery, a first flexible circuit board connected to the battery protection board and the first board, and a second flexible circuit board connected to the battery protection board and the second board. The first board and the second board are arranged at intervals along a first direction, and the battery protection board and the cell are arranged in sequence along a second direction substantially perpendicular to the first direction. The electronic device according to the present disclosure has a short charging path and low heat as charging, and high safety and so on.

According to a second aspect of the present disclosure, an electronic device is provided and includes a housing including a first side edge, a second side edge opposite to and substantially parallel to the first side edge, and having a power interface, a third side edge substantially perpendicular to the first side edge, and a fourth side edge opposite to and substantially parallel to the third side edge; a battery arranged in the housing and including a cell and a battery protection board arranged at a side of the cell close to the third side edge or the second side edge; and a circuit board assembly arranged in the housing, electrically connected to the power interface, and including a first board arranged at a side of the battery close to the first side edge, a second board arranged at a side of the battery close to the second side edge, a first flexible circuit board connected the battery protection board and the first board, and a second flexible circuit board, connected the battery protection board and the second board. The electronic device according to the present disclosure has a short charging path and low heat as charging, and high safety and so on.

DETAILED DESCRIPTION

Figure 1:
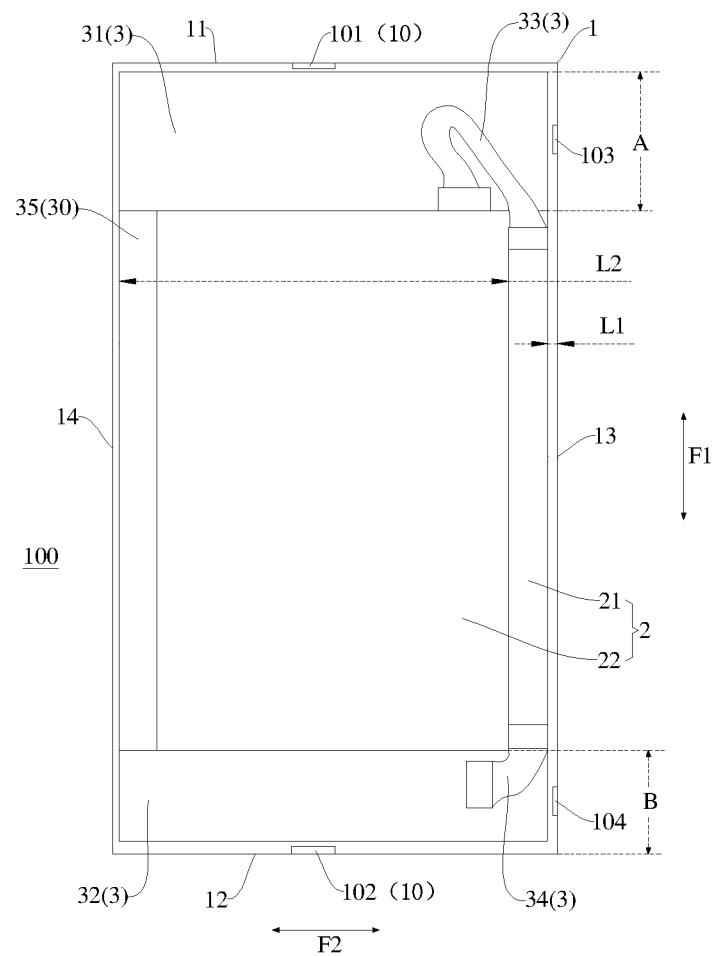
FIG. 1 is a structural schematic view of an electronic device according to one embodiment of the present disclosure.

The embodiments of the present disclosure will be described in detail below. Examples of the embodiments may be illustrated in the drawings. Same or similar reference numerals may be used to indicate same or similar elements or elements having same or similar functions. The embodiments described below with reference to the drawings are illustrative, and are not intended to be construed as limitations.

The following disclosure provides many different embodiments or examples for implementing different structures of the present disclosure. In order to simplify the present disclosure, components and arrangements of specific examples are described below. Of course, these are merely examples, and are not intended to limit the present disclosure. In addition, reference numerals and/or reference letters are repeated in different examples of the present disclosure. The repetition is for the purpose of simplicity and clarity, and do not indicate the relationship between various embodiments and/or arrangements discussed herein. Moreover, examples of various specific processes and materials are provided in the present disclosure. However, those skilled in the art may recognize applications of other processes and/or usages of other materials.

According to a first aspect of the present disclosure, an electronic device is provided and includes: a housing defined with a power interface on the housing; a battery arranged in the housing, and including a battery protection board and a cell; a circuit board assembly arranged in the housing, electrically connected to the power interface, and including a first board located at one side of the battery; a second board located at the other side of the battery, a first flexible circuit board connected to the battery protection board and the first board, and a second flexible circuit board connected to the battery protection board and the second board. The first board and the second board are arranged at intervals along a first direction, and the battery protection board and the cell are arranged in sequence along a second direction substantially perpendicular to the first direction.

In some embodiments, a length direction of the battery protection board is a direction from the first board to the second board, and the battery protection board is arranged at a side portion between of space the first board and the second board.

In some embodiments, the first flexible circuit board is connected to a side portion of the first board close to the battery protection board, and the second flexible circuit board is connected to a side portion of the second board close to the battery protection board.

In some embodiments, the first flexible circuit board is connected to one end of a length direction of the battery protection board, and the second flexible circuit board is connected to the other end of the length direction of the battery protection board.

In some embodiments, the length direction of the battery protection board is a length direction of the electronic device.

In some embodiments, wherein the housing includes a first side edge, a second side edge opposite to and substantially parallel to the first side edge, a third side edge and a fourth side edge opposite to and substantially parallel to the third side edge. The first side edge is arranged at one side of a length direction of the third side edge and the fourth side edge, the second side edge is arranged at the other side of the length direction of the third side edge and the fourth side edge, the first board is arranged at a side of the second board close to the first side edge, the second board is arranged at a side of the first board close to the second side edge, and the battery protection board is substantially parallel to the third side edge and the fourth side edge.

In some embodiments, the power interface includes a first sub power interface arranged on the first side edge, and the first sub power interface is electrically connected to the first board to charge the battery through the first flexible circuit board.

In some embodiments, the power interface includes a second sub power interface arranged on the second side edge, and the second sub power interface is electrically connected to the second board to charge the battery through the second flexible circuit board.

In some embodiments, the power interface includes a third sub power interface arranged on the third side edge, the third sub power interface is located in an orthographic projection of the first board on the third side edge, and electrically connected to the first board to charge the battery through the first flexible circuit board.

In some embodiments, the power interface includes a fourth sub power interface arranged on the third side edge, the fourth sub power interface is located in an orthographic projection of the second board on the third side edge, and electrically connected to the second board to charge the battery through the second flexible circuit board.

In some embodiments, a distance between a side portion of the battery protection board close to the fourth side edge and the third side edge is less than that between the side portion of the battery protection board and the fourth side edge.

In some embodiments, the circuit board assembly further includes a transition board connected to the first board and the second board.

In some embodiments, the transition board includes a third flexible circuit board connected to the first board and the second board, and the third flexible circuit is arranged on a side of the battery in a thickness direction of the battery According to a second aspect of the present disclosure, an electronic device is provided and includes: a housing including a first side edge, a second side edge opposite to and substantially parallel to the first side edge, and having a power interface, a third side edge substantially perpendicular to the first side edge, and a fourth side edge opposite to and substantially parallel to the third side edge; a battery arranged in the housing, including a cell, and a battery protection board arranged at a side of the cell close to the third side edge or the second side edge; and a circuit board assembly arranged in the housing, electrically connected to the power interface, and including a first board arranged at a side of the battery close to the first side edge, a second board arranged at a side of the battery close to the second side edge, a first flexible circuit board connected the battery protection board and the first board, and a second flexible circuit board connected the battery protection board and the second board.

In some embodiments, a length direction of the battery protection board is a direction from the first board to the second board, and the battery protection board is arranged at a side portion of space between the first board and the second board.

In some embodiments, the first flexible circuit board is connected to a side portion of the first board close to the battery protection board, and the second flexible circuit board is connected to a side portion of the second board close to the battery protection board.

In some embodiments, the battery protection board is substantially parallel to the third side edge and the fourth side edge.

According to a third aspect of the present disclosure, an electronic device is provided and includes: a housing defined with a power interface on the housing; a battery arranged in the housing, and including a battery protection board and a cell; a circuit board assembly arranged in the housing, electrically connected to the power interface, and including a first board located at one side of the battery; a second board located at the other side of the battery, a first flexible circuit board connected to the battery protection board and the first board, and a second flexible circuit board connected to the battery protection board and the second board. The first board and the second board are arranged along a first direction, and the battery protection board is arranged at a side portion of space between the first board and the second board along a second direction substantially perpendicular to the first direction.

In some embodiments, the battery protection board and the cell are arranged in sequence along the second direction.

In some embodiments, the first flexible circuit board is connected to a side portion of the first board close to the battery protection board, and the second flexible circuit board is connected to a side portion of the second board close to the battery protection board.

In the related art, during some electronic devices being charged, a current may arrive a second board first from a power interface, then be transported from the second board to a first board through a flexible circuit board, and further be transported from the first board to a battery through another flexible circuit board, and accordingly a charging path is relatively long. In response to the electronic devices are quickly charged in a current increasing manner, due to a current flowing path being relatively long and a current flow being relatively large, a current loss may be easy to be caused, such that a heat during the electronic devices being charged may be increased and a charging efficiency may be reduced. Furthermore, the electronic devices may be burnt, even safety accidents may be caused, such as the electronic devices on fire, the batteries explosions, and so on. Therefore, an electronic device 100 is provided in the present disclosure and has a short charging path and low heat as charging, and high safety and so on.

An electronic device 100 according to embodiments of the present disclosure will be described in the following, with reference to the accompanying drawings.

As shown in FIG. 1, the electronic device 100 according to embodiments of the present disclosure may include a housing 1, a battery 2 and a circuit board assembly 3. A power interface 10 is defined on the housing 1, the battery 2 is arranged in the housing 1 and includes a battery protection board 21 and a cell 22. The circuit board assembly 3 is arranged in the housing 1, electrically connected to the power interface 10. In this way, the battery may be get charged in response to the power interface 10 being connected to a power outlet through a power cord and a power plug.

In FIG. 1, the circuit board assembly 3 may include a first board 31, a second board 32, a first flexible circuit board 33 and a second flexible circuit board 34. The first board 31 and the second board 32 are arranged at intervals along a first direction (direction F1 as shown in FIG. 1), and the battery protection board 21 and the cell 22 are arranged in sequence along a second direction (direction F2 as shown in FIG. 1) substantially perpendicular to the first direction. The first flexible circuit board 33 is connected to the battery protection board 21 and the first board 31, and the second flexible circuit board 34 is connected to the battery protection board 21 and the second board 32.

That is, the battery 2 is sandwiched between the first board 31 and the second board 32, and the battery protection board 21 is located at a side of the cell 22, which is not the case that the battery protection board 21 is located at a side of the cell 22 close to the first board 31, or located at a side of the cell 22 close to the second board 32. In this way, a length of the first flexible circuit board 33 connecting the first board 31 and the battery protection board 21 may be configured to be shorter, and a length of the second flexible circuit board 34 connecting the second board 32 and the battery protection board 21 may also be configured to be shorter.

In this way, through the battery protection board 21 being located at the side of the cell 22, the first flexible circuit board 33 being connected to the battery protection board 21 and the first board 31, and the second flexible circuit board 34 being connected to the battery protection board 21 and the second board 32, a current transmission path between the battery 2 and the first board 31 and a current transmission path between the battery 2 and the second board 32 may be effectively reduced. In this way, whether the first board 31 and the first flexible circuit board 33 are used to charge the battery 2, or the second board 32 and the second flexible circuit board 34 are used to charge the battery 2, a charging path may be reduced. Heat generated as charging, charging efficiency and charging safety may be improved. In addition, in response to one of the first flexible circuit board 33 and the second flexible circuit board 34 is used to charge the battery 2, the other one of the first flexible circuit board 33 and the second flexible circuit board 34 may be used to discharge the battery 2, such that a power supply need may be satisfied and the electronic device 100 may be ensured to be work normally.

Figure 2:
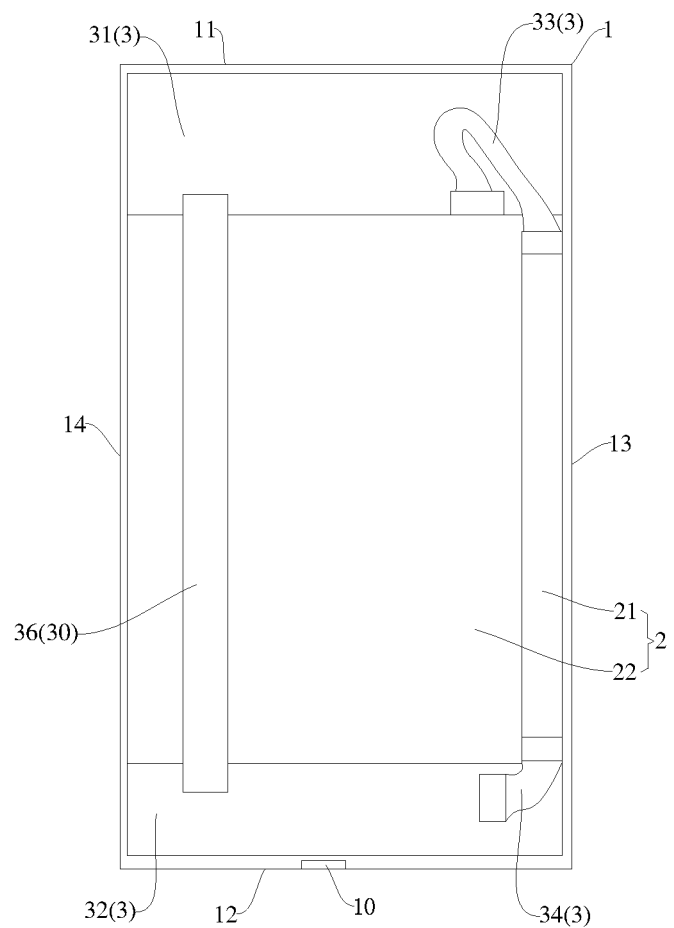
FIG. 2 is a structural schematic view of the electronic device according to another embodiment of the present disclosure.

For example, in embodiments shown in the FIG. 1 and FIG. 2, a length direction (the direction F1 as shown in FIG. 1) of the battery protection board 21 is a direction from the first board 31 to the second board 32. That is, the first board 31 and the second board 32 are arranged at intervals along the length direction of the battery protection board 21, the first board 31 is arranged at a side of the battery 2, and the second board 32 is arranged at the other side of the battery. The first flexible circuit board 33 is connected between the battery protection board 21 and the first board 31, the second flexible circuit board 34 is connected between the battery protection board 21 and the second board 32. In this way, the first board 31 is arranged at one side of the length direction of the battery protection board 21, and the second board 32 is arranged at the other side of the length direction of the battery protection board 21, such that one end of the length direction of the battery protection board 21 (for example, a top end of the battery protection board 21 shown in the FIG. 1) may be close to the first board 31, and the other end of the length direction of the battery protection board 21 (for example, a bottom end of the battery protection board 21 shown in the FIG. 1) may be close to the second board 32. As a result, the current transmission path may be effectively reduced.

For example, in some specific embodiments of the present disclosure, the power interface 10 is connected with the second board 32, in which case the second flexible circuit board 34 may be used to the second board to charge the battery 2, and the first flexible circuit board 33 may be used to the battery 2 to discharge the first board. Moreover, in the present embodiment, there are a plurality of ways for the second board 32 to obtain a discharge from the battery 2, for example, the battery 2 may discharge the second board 32 by the second flexible circuit board 34 in response to the power interface 10 being not connected to the power outlet. For another example, in response to the circuit board assembly 3 includes a transition board 30 connected to the first board 31 and the second board 32, the battery 2 may also discharge the second board 32 by the transition board 30, such that a discharge from the battery to the first board 31 may also be transited to the second board 32 through the transition board 30.

Therefore, the battery protection board 21 is arranged at a side of the battery 2 such that the first board 31 may be arranged at one side of a length direction of the battery protection board 21 and the second board 32 may be arranged at the other side of the length direction of the battery protection board 21. In this way, two flexible circuit board may be extended out from the battery protection board 21, that is, the first flexible circuit board 33 used to connected to the first board 31 and the second flexible circuit board 34 used to connected to the second board 32. Thus, in response to the second board 32 being connected to the power interface 10, the second flexible circuit board 34 may be used as a charging flexible circuit board to charge the battery 2 through the second board 32 being connected to the power interface 10, and the first flexible circuit board 33 may be used as a discharging flexible circuit board to make the battery 2 supply power to the first board 31. Similarly, in response to the first board 31 being connected to the power interface 10, the first flexible circuit board 33 may be used as a charging flexible circuit board to charge the battery 2 through the first board 31 being connected to the power interface 10, and the second flexible circuit board 34 may be used as a discharging flexible circuit board to make the battery 2 supply power to the second board 32.

A heating loss calculation formula during a charging process of the battery 2 is $P=I^2R$, wherein I is a charging current and R is a loop impedance, since the present disclosure can reduce a length of the flexible circuit board used to charge the battery 2, a charging loop impedance R may be reduced, and a reduction amount of R is related to the length of the battery 2, such that the heating loss may be reduced and the charging efficiency may be improved, which may be more significant in a case of high-current charging.

In short, the electronic device 100 according to the embodiments of the present disclosure, since the first board 31 is arranged at one side of a length direction of the battery protection board 21 and the second board 32 is arranged at the other side of the length direction of the battery protection board 21, that is, the battery 2 is arranged at a side portion of space between the first board 31 and the second board 32. Further, the first flexible circuit board 33 and the second flexible circuit board 34 are arranged, such that the charging path may be shortened to reduce the heating as charging, and the user experience may be improved.

It should be noted that a composition and function of "the battery protection board 21" are well known to those skilled in the art. That is, for a rechargeable battery 2, such as a lithium battery, an integrated circuit board acting as a protective role, etc., for example, for the rechargeable lithium battery, a reason why a protection is needed is determined by its own characteristics. A material of the lithium battery itself determines that it cannot be overcharged, over discharged, with an overcurrent, with a short circuit, and charged and discharged under an ultra-high temperature, thus the lithium battery always be with a protection board with a sampling resistor and a current fuse. Therefore, it will not be repeated here.

In addition, after a specific type of the electronic device 100 is determined, a specific composition and function of the "the first board 31" and the "the second board 32" are also well known to those skilled in the art. For example, in a case that the electronic device 100 is a smart phone, those skilled in the art can clearly understand what the first board 31" and "the second board 32" refer to. Of course, the electronic device 100 according to the embodiments of the present disclosure is not limited to a smart phone, for example, may be a tablet computer, a vehicle-mounted computer, etc., and no limitation is made here.

It should be noted that the cell 22 may be one or multiple, and the battery protection board 21 is connected to tabs of each of the cells 22. In some embodiments of the present disclosure, the battery 2 may have only one cell 22. In other embodiments of the present disclosure, the battery 2 may also have multiple cells 22, and the multiple cells 22 are connected in series and/or in shunts, that is, the multiple cells 22 may be connected in series, or the multiple cells 22 may be connected in shunts, or the multiple cells 22 may be connected first in series and then in shunts, or the multiple cells 22 may be connected first in shunts and then in series, etc. In this way, different practical requirements may be satisfied.

In some embodiments of the present disclosure, the circuit board assembly 3 may include the transition board 30 connected to the first board and the second board. In response to the battery 2 discharging to the first board 31 through the first flexible circuit board 33, the first board 31 may discharge to the second board 32 through the transition board 30. In response to the battery 2 discharging to the second board 32 through the second flexible circuit board 34, the second board 32 may discharge to the first board 31 through the transition board 30. In this way, the electronic device may be work normally.

In some specific embodiments of the present disclosure, as shown in FIG. 1, the transition board the transition board 30 may include a rigid circuit board 35 connected to the first board the first board 31 and the second board the second board 32, and the rigid circuit board 35 is located on a side of the battery the battery 2 away from the battery protection board the battery protection board 21. For example, in the embodiment shown in FIG. 1, in response to the battery protection board the battery protection board 21 is located on a right side of the battery 2, the rigid circuit board 35 is located on a left side of the battery 2, such that a space may be more fully utilized and an assembly may be facilitated.

In some specific embodiments of the present disclosure, in FIG. 2, the transition board 30 may include a third flexible circuit board 36 connected to the first board 31 and the second board 32, and the third flexible circuit board 36 is arranged on a side of the battery 2 in a thickness direction of the battery 2. In this way, there may be more accommodating space for the battery 2 to be reserved such that a capacity of the battery 2 may be larger to satisfy a longer standby time.

In some embodiments, as shown in FIG. 1, the battery protection board 21 is arranged at the side portion of the space between the first board 31 and the second board 32. A meaning of "the side portion of the space between the first board 31 and the second board 32" will be explained in the following, that is, the length direction of the battery protection board 21 is defined to be the first direction F1, the first direction F1 is substantially perpendicular to the second direction F2. Two ends of the first board 31 in the second direction F2 are a first end and second end, and two ends of the second board 32 in the second direction F2 are a third end and a fourth end. The first end is opposite to the second end in the first direction F1, and the third end is opposite to the fourth end in the first direction F1. The battery protection board 21 is arranged between the first end and the third end, or between the second and the fourth end. That is, the battery protection board 21 is arranged close to a side edge of the space between the first board 31 and the second board 32, such that an accommodating space for the cell 22 may be increased and the capacity and endurance of the battery 2 may be improved.

As shown in FIG. 1, the first flexible circuit board 33 is connected to a side portion of the first board 31 close to the battery protection board 21, and the second flexible circuit board 34 is connected to a side portion of the second board 32 close to the battery protection board 21. In this way, the length of the first flexible circuit board 33 may be further shortened, and the length of the second flexible circuit board 34 may be further shortened. As a result, the charging path may be shortened to reduce the heating as charging, and the user experience may be improved. For example, in the embodiments shown in FIG. 1, in response to the battery protection board 21 being arranged at a right side portion of the space between the first board 31 and the second board 32, the first flexible circuit board 33 is connected to a right end of the first board 31, and the second flexible circuit board 34 is connected to a right end of the second board 32.

As shown in FIG. 1, the first flexible circuit board 33 is connected to one end of the length direction of the battery protection board 21, and the second flexible circuit board 34 is connected to the other end of the length direction of the battery protection board 21. In this way, the length of the first flexible circuit board 33 may be further shortened, and the length of the second flexible circuit board 34 may be further shortened. As a result, the charging path may be shortened to reduce the heating as charging, and the user experience may be improved. For example, in the specific embodiment shown in FIG. 1, the length direction of the battery protection board 21 is an up-down direction. The first flexible circuit board 33 may be connected to a top end of the battery protection board 21, and the second flexible circuit board 34 may be connected to a bottom end of the battery protection board 21. Of course, the present disclosure is not limited to thereto, the first flexible circuit board 33 and the second flexible circuit board 34 may also be connected to other parts of the battery protection board 21 to better satisfy different actual requirements.

In some embodiments, as shown in FIG. 1, the length direction of the battery protection board 21 (for example, the F1 direction shown in FIG. 1) may be a length direction of the electronic device 100. Therefore, for most electronic devices, there is no need to greatly improve structure types of the first board 31 and the second board 32, and there is also no need to greatly improve an overall layout of the electronic devices. In this way, it may be more convenient for a mass production and a production cost may be reduced.

In some embodiments, as shown in FIG. 1, the housing 1 may include a first side edge 11, a second side edge 12 opposite to and substantially parallel to the first side edge 11, a third side edge 13, and a fourth side edge 14 opposite to and substantially parallel to the third side edge 13. The first side edge 11 is arranged at one side of a length direction of the third side edge 13 and the fourth side edge 14, and the second side edge 12 is arranged at the other side portion of the third side edge 13 and the fourth side edge 14. The first board 31 is arranged at a side portion of the second board 32 close to the first side edge 11, the second board 32 is arranged at a side portion of the first board 31 close to the second side edge 12, and the battery protection board 21 is substantially parallel to the third side edge 13 and the fourth side edge 14. In this way, a structure of the housing 1 may be simple, so as to facilitate producing and processing, and facilitate an assembly of the first board 31, the second board 32 and the battery 2.

It should be noted that a number and a specific arrangement location of the power interface 10 are not limited. The specific locations of the power interface 10 in some embodiments of the present disclosure will be described in the following, but the present disclosure is not limited to the following embodiments.

For example, in the embodiments shown in FIG. 1, the power interface 10 may include a first sub power interface 101 arranged on the first side edge 11, and the first sub power interface 101 is electrically connected to the first board 31 to charge the battery 2 through the first flexible circuit board 33. That is, in response to the first sub power interface 101 being connected to the power outlet, the first board 31 may charge the battery 2 through the first flexible circuit board 33, and the battery 2 may discharge to the second board 32 through the second flexible circuit board 34. In this way, since a distance between the first side edge 11 and the first board 31 is relatively short, a distance between the first sub power interface 101 and the first board 31 may be shortened, and the charging path may be further shortened, so as to reduce the heating as charging and improve the user experience.

For example, in the embodiments shown in FIG. 1, the power interface 10 may include a second sub power interface 102 arranged on the second side edge 12, and the second sub power interface 102 is electrically connected to the second board 32 to charge the battery 2 through the second flexible circuit board 34. That is, in response to the second sub power interface 102 being connected to the power outlet, the second board 32 may charge the battery 2 through the second flexible circuit board 34, and the battery 2 may discharge to the first board 31 through the first flexible circuit board 33. In this way, since a distance between the second side edge 12 and the second board 32 is relatively short, a distance between the second sub power interface 102 and the second board 32 may be shortened, and the charging path may be further shortened, so as to reduce the heating as charging and improve the user experience.

For example, in the embodiments shown in FIG. 1, the power interface 10 may include a third sub power interface 103 arranged on the third side edge 13, the third sub power interface 103 is located in an orthographic projection (for example, A region shown in FIG. 1) of the first board 31 on the third side edge 13, and electrically connected to the first board 31 to charge the battery 2 through the first flexible circuit board 33. That is, in response to the third sub power interface 103 being connected to the power outlet, the first board 31 may charge the battery 2 through the first flexible circuit board 33, and the battery 2 may discharge to the second board 32 through the second flexible circuit board 34. In this way, since a distance between the third sub power interface 103 and the first board 31 is relatively short, the charging path may be further shortened to reduce the heating as charging and improve the user experience. In addition, in the present embodiment, in response to a distance L1 between a side portion of the battery protection board 21 close to the fourth side edge and the third side edge 13 being less than a distance L2 between the side portion of the battery protection board 21 and the fourth side edge 14, a distance between the first flexible circuit board 33 and the third sub power interface 103 may be further shortened, such that a power transferring length from the third sub power interface 103 to the first flexible circuit board 33 may be shortened. In this way, the charging path may be further shortened, so as to reduce the heating as charging and improve the user experience.

For example, in the embodiments shown in FIG. 1, the power interface 10 may include a fourth sub power interface 104 arranged on the third side edge 13, the fourth sub power interface 104 is located in an orthographic projection of the second board 32 on the third side edge 13, and electrically connected to the second board 32 to charge the battery 2 through the second flexible circuit board 34. That is, in response to the fourth sub power interface 104 being connected to the power outlet, the second board 32 may charge the battery 2 through the second flexible circuit board 34, and the battery 2 may discharge to the first board 31 through the first flexible circuit board 33. In this way, since a distance between the fourth sub power interface 104 and the second board 32 is relatively short, the charging path may be further shortened, so as to reduce the heating as charging and improve the user experience. In addition, in the present embodiment, in response to the distance L1 between the side portion of the battery protection board 21 close to the fourth side edge and the third side edge 13 being less than the distance L2 between the side portion of the battery protection board 21 and the fourth side edge 14, a distance between the second flexible circuit board 34 and the fourth sub power interface 104 may be further shortened, such that a power transferring length from the fourth sub power interface 104 to the second flexible circuit board 34 may be shortened. In this way, the charging path may be further shortened, so as to reduce the heating as charging and improve the user experience.

In a specific embodiment of the present disclosure, the battery 2 is configured to be a structure where the battery protection board 21 is arranged on a side, the first flexible circuit board 33 extends out from one end of the battery protection board 21 and connected to the first board 31, and the second flexible circuit board 34 extends out from the other end of the battery protection board 21 and connected to the first board 31. The power interface 10 is arranged at a position close to the second board 32. The secondary board 32 charges the battery 2 through the second flexible circuit board 34, and the battery 2 discharges to the first board 31 through the first flexible circuit board 33, so as to shorten the charging path and improve a charging effect. In addition, in the embodiments of the present disclosure, the power interface 10 may be arranged at a bottom, a side, or even a top of the electronic device 100, such that the charging path may be shortened, the heating as charging may be reduced, and the user experience may be improved. Moreover, in the embodiments of the present disclosure, the first board 31 and the second board 32 may be arranged to be a separate form by the third flexible circuit board 36, or may be arranged to be an integral form by the rigid circuit board 35, which is not limited.

In a specific embodiment of the present disclosure, in FIGS. 1 and 2, the electronic device 100 includes: a housing 1 including a first side edge 11, a second side edge 12 opposite to and substantially parallel to the first side edge 11, and having a power interface 10, a third side edge 13 substantially perpendicular to the first side edge 11, and a fourth side edge 14 opposite to and substantially parallel to the third side edge 13; a battery 2 arranged in the housing 1 and including a cell 22, and a battery protection board 21 arranged at a side of the cell 22 close to the third side edge 13 or the second side edge 12; and a circuit board assembly 3 arranged in the housing 1, electrically connected to the power interface 10 and including a first board 31 arranged at a side of the battery 2 close to the first side edge 11, a second board 32 arranged at a side of the battery 2 close to the second side edge 12, a first flexible circuit board 33 connected the battery protection board 21 and the first board 31, and a second flexible circuit board 34 connected the battery protection board 21 and the second board 32. In the present embodiment, the battery protection board 21 is arranged on a side portion of the electronic device 100, such that the electronic device 100 may have a simple structure and the charging path may be short.

Figure 3:
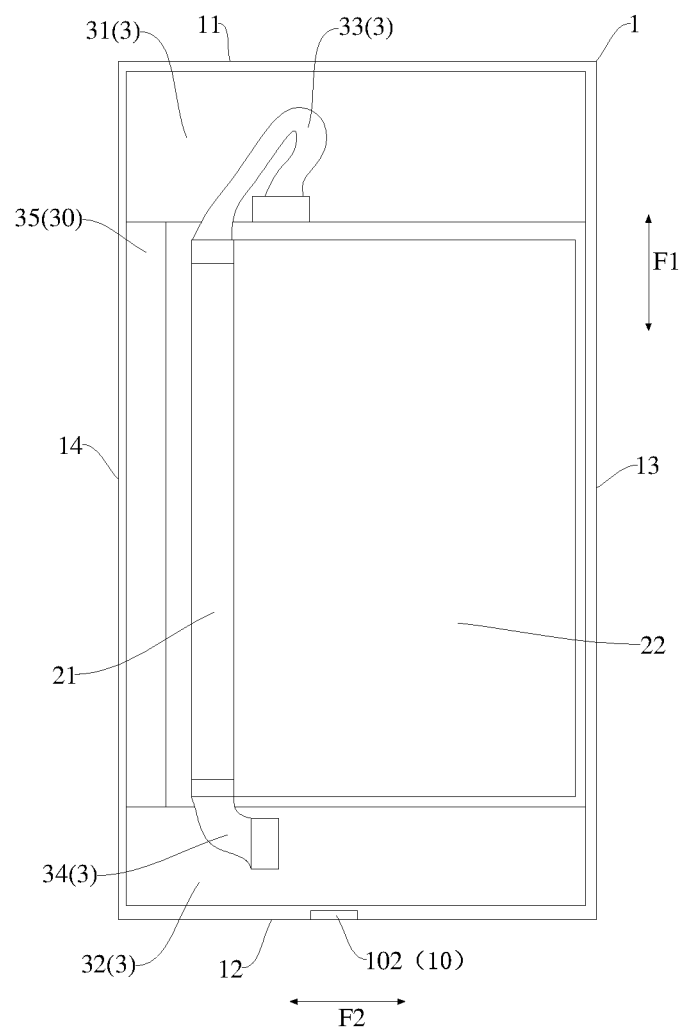
FIG. 3 is a structural schematic view of the electronic device according to another embodiment of the present disclosure.
Figure 4:
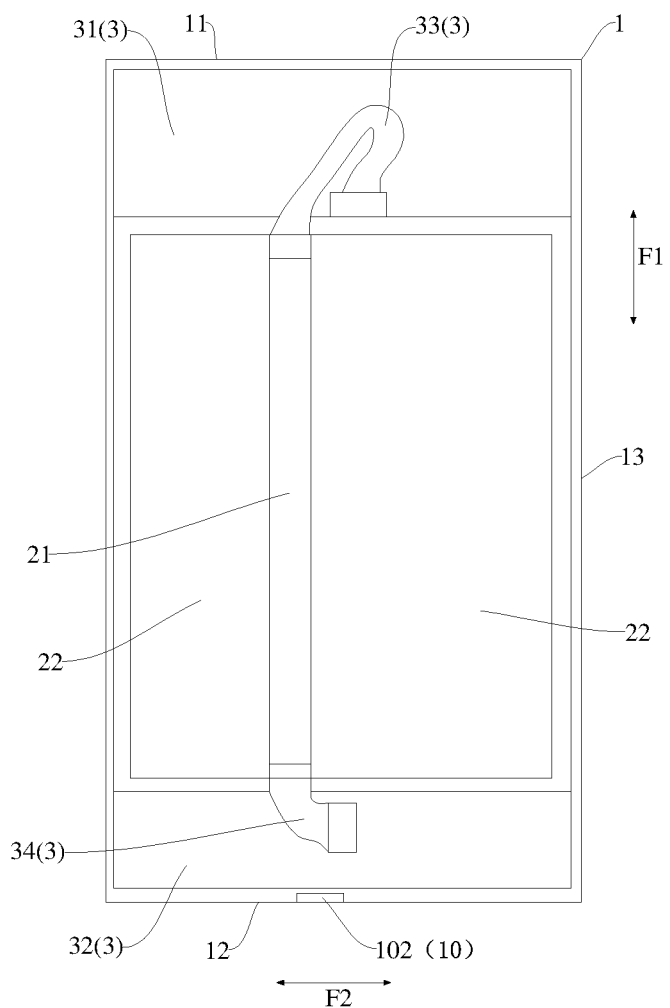
FIG. 4 is a structural schematic view of the electronic device according to another embodiment of the present disclosure.

Of course, the present disclosure is not limited to thereto. In other embodiments of the present disclosure, the battery protection board 21 may also be arranged in other positions of the electronic device 100. For example, in the embodiment shown in FIG. 3, the battery protection board 21 may be arranged between the rigid circuit board 35 and the cell 22. For a further example, in the embodiment shown in FIG. 4, the battery protection board 21 may be arranged between the two cells 22, located in a center position of the electronic device 100, etc., which will not be repeated herein.

In addition, other configurations and operations of the electronic device 100 according to the embodiments of the present disclosure are known to those of ordinary skill in the art after the type of the electronic device 100 is determined, which will not be described in detail here.

In the description of the present specification, the description with reference to the terms "one embodiment", "some embodiments", "illustrative embodiment", "example", "specific example", or "some examples", and the like, means that a specific feature, structure, material, or characteristic described in connection with the embodiment or example is included in at least one embodiment or example of the present disclosure. Thus, the illustrative descriptions of the terms throughout this specification are not necessarily referring to the same embodiment or example of the present disclosure. Furthermore, the specific features, structures, materials, or characteristics may be combined in any suitable manner in one or more embodiments or examples. In addition, various embodiments or examples described in the specification and features of various embodiments or examples, may be incorporated and combined by those skilled in the art in case of an absence of confliction.

Although the embodiments of the present disclosure have been shown and described, those of ordinary skill in the art can understand that various changes, modifications, substitutions and variations can be made to the embodiments without departing from the principle and purpose of the present disclosure. The scope of the present disclosure is defined by the claims and the equivalents of the claims.

What is claimed is:

1. An electronic device, comprising:
a housing, defined with a power interface on the housing;
a battery, arranged in the housing, and comprising:
   a battery protection board; and
   a cell; and
a circuit board assembly, arranged in the housing, electrically connected to the power interface, and comprising:
   a first board, located at one side of the battery;
   a second board, located at the other side of the battery;
   a first flexible circuit board, connected to the battery protection board and the first board; and
   a second flexible circuit board, connected to the battery protection board and the second board;
wherein the first board and the second board are arranged at intervals along a first direction, and the battery protection board and the cell are arranged in sequence along a second direction substantially perpendicular to the first direction,
wherein the housing comprises a first side edge, the power interface comprises a first sub power interface arranged on the first side edge, and the first sub power interface is electrically connected to the first board to charge the battery through the first flexible circuit board.

2. The electronic device according to claim 1, wherein a length direction of the battery protection board is a direction from the first board to the second board, and the battery protection board is arranged at a side portion of space between the first board and the second board.

3. The electronic device according to claim 2, wherein the first flexible circuit board is connected to a side portion of the first board close to the battery protection board, and the second flexible circuit board is connected to a side portion of the second board close to the battery protection board.

4. The electronic device according to claim 2, wherein the length direction of the battery protection board is a length direction of the electronic device.

5. The electronic device according to claim 4, wherein the housing further comprises:
a second side edge, opposite to and substantially parallel to the first side edge;
a third side edge; and
a fourth side edge, opposite to and substantially parallel to the third side edge;
wherein the first side edge is arranged at one side of a length direction of the third side edge and the fourth side edge, the second side edge is arranged at the other side of the length direction of the third side edge and the fourth side edge, the first board is arranged at a side of the second board close to the first side edge, the second board is arranged at a side of the first board close to the second side edge, and the battery protection board is substantially parallel to the third side edge and the fourth side edge.

6. The electronic device according to claim 5, wherein the power interface comprises a second sub power interface arranged on the second side edge, and the second sub power interface is electrically connected to the second board to charge the battery through the second flexible circuit board.

7. The electronic device according to claim 5, wherein the power interface comprises a third sub power interface arranged on the third side edge, the third sub power interface is located in an orthographic projection of the first board on the third side edge, and electrically connected to the first board to charge the battery through the first flexible circuit board.

8. The electronic device according to claim 7, wherein a distance between a side portion of the battery protection board close to the fourth side edge and the third side edge is less than that between the side portion of the battery protection board and the fourth side edge.

9. The electronic device according to claim 5, wherein the power interface comprises a fourth sub power interface arranged on the third side edge, the fourth sub power interface is located in an orthographic projection of the second board on the third side edge, and electrically connected to the second board to charge the battery through the second flexible circuit board.

10. The electronic device according to claim 1, wherein the first flexible circuit board is connected to one end of a length direction of the battery protection board, and the second flexible circuit board is connected to the other end of the length direction of the battery protection board.

11. The electronic device according to claim 1, wherein the circuit board assembly further comprises a transition board connected to the first board and the second board.

12. The electronic device according to claim 11, wherein the transition board comprises a third flexible circuit board connected to the first board and the second board, and the third flexible circuit board is arranged on a side of the battery in a thickness direction of the battery.

13. An electronic device, comprising:
a housing, comprising:
  a first side edge;
  a second side edge, opposite to and substantially parallel to the first side edge, and having a power interface;
  a third side edge, substantially perpendicular to the first side edge; and
  a fourth side edge, opposite to and substantially parallel to the third side edge;
a battery, arranged in the housing, comprising:
  a cell; and
  a battery protection board, arranged at a side of the cell close to the third side edge or the second side edge; and
a circuit board assembly, arranged in the housing, electrically connected to the power interface, and comprising:
  a first board, arranged at a side of the battery close to the first side edge;
  a second board, arranged at a side of the battery close to the second side edge;
  a first flexible circuit board, connected the battery protection board and the first board; and
  a second flexible circuit board, connected the battery protection board and the second board,
  wherein the power interface comprises a first sub power interface arranged on the first side edge, and the first sub power interface is electrically connected to the first board to charge the battery through the first flexible circuit board.

14. The electronic device according to claim 13, wherein a length direction of the battery protection board is a direction from the first board to the second board, and the battery protection board is arranged at a side portion of space between the first board and the second board.

15. The electronic device according to claim 14, wherein the first flexible circuit board is connected to a side portion of the first board close to the battery protection board, and the second flexible circuit board is connected to a side portion of the second board close to the battery protection board.

16. The electronic device according to claim 13, wherein the battery protection board is substantially parallel to the third side edge and the fourth side edge.

17. An electronic device, comprising:
a housing, defined with a power interface on the housing;
a battery, arranged in the housing, and comprising:
  a battery protection board; and
  a cell;
a circuit board assembly, arranged in the housing, electrically connected to the power interface, and comprising:
  a first board, located at one side of the battery;
  a second board, located at the other side of the battery;
  a first flexible circuit board, connected to the battery protection board and the first board; and
  a second flexible circuit board, connected to the battery protection board and the second board;
wherein the first board and the second board are arranged along a first direction, and the battery protection board is arranged at a side portion of space between the first board and the second board along a second direction substantially perpendicular to the first direction,
wherein the housing comprises a first side edge, the power interface comprises a first sub power interface arranged on the first side edge, and the first sub power interface is electrically connected to the first board to charge the battery through the first flexible circuit board.

18. The electronic device according to claim 17, wherein the battery protection board and the cell are arranged in sequence along the second direction.

19. The electronic device according to claim 18, wherein the first flexible circuit board is connected to a side portion of the first board close to the battery protection board, and the second flexible circuit board is connected to a side portion of the second board close to the battery protection board.

* * * * *